US00RE49135E

(19) United States
(12) Reissued Patent
Park et al.

(10) Patent Number: US RE49,135 E
(45) Date of Reissued Patent: Jul. 12, 2022

(54) FLAT PANEL DISPLAY DEVICE, METHOD OF AGING THE SAME, AND METHOD OF TESTING LIGHTING OF THE SAME

(71) Applicant: Samsung Display Co., Ltd., Yongin-si (KR)

(72) Inventors: Ok-Kyung Park, Yongin-si (KR); Ji-Hyun Ka, Yongin-si (KR)

(73) Assignee: Samsung Display Co., Ltd., Yongin-si (KR)

(21) Appl. No.: 16/555,518

(22) Filed: Aug. 29, 2019

Related U.S. Patent Documents

Reissue of:
(64) Patent No.: 9,747,831
Issued: Aug. 29, 2017
Appl. No.: 14/804,250
Filed: Jul. 20, 2015

U.S. Applications:
(63) Continuation of application No. 12/385,153, filed on Mar. 31, 2009, now Pat. No. 9,087,479.

(30) Foreign Application Priority Data

Apr. 1, 2008 (KR) ..... 10-2008-0030261

(51) Int. Cl.
*G09G 3/30* (2006.01)
*G09G 3/00* (2006.01)
(Continued)

(52) U.S. Cl.
CPC ..... *G09G 3/30* (2013.01); *G09G 3/006* (2013.01); *G09G 3/3258* (2013.01);
(Continued)

(58) Field of Classification Search
CPC ..... G09G 3/006; G09G 3/30; G09G 3/3648; G09G 3/3258; G09G 2300/0452;
(Continued)

(56) References Cited

U.S. PATENT DOCUMENTS 6,160,535 A * 12/2000 Park ..... G09G 3/3607 345/100
6,198,507 B1 3/2001 Ishigami
(Continued)

FOREIGN PATENT DOCUMENTS

JP 2002-328397 11/2002
KR 10-2004-0092397 11/2004
(Continued)

OTHER PUBLICATIONS

Korean Notice of Allowance issue by KIPO on Aug. 28, 2009 in corresponding Korean Patent Application No. 10-2008-0030261 (cited in IDS filed on Nov. 5, 2009 of parent U.S. Appl. No. 12/385,153, filed Mar. 31, 2009).
(Continued)

*Primary Examiner* — Christina Y. Leung
(74) *Attorney, Agent, or Firm* — H.C. Park & Associates, PLC

(57) ABSTRACT

A flat panel display device formed in a pentile structure is provided, which includes a pixel portion and a lighting tester. The pixel portion includes a first pixel column, a second pixel column and a third pixel column. In the first pixel column, first pixels for displaying a first color and second pixels for displaying a second color are alternately arranged in a direction the data lines. In the second pixel column, first and second pixels arranged in reverse order of the first pixel column in a direction parallel to the data lines. In the third pixel column, third pixels for displaying a third color are arranged in a direction parallel to the data lines. The lighting tester applies a first voltage to the first pixel column and applies a second voltage to the second pixel column during a first time period. The lighting tester applies the second voltage to the first pixel column and applies the
(Continued)

first voltage to the second pixel column during a second time period.

33 Claims, 2 Drawing Sheets

(51) Int. Cl.
*G09G 3/3258* (2016.01)
*G09G 3/36* (2006.01)
*H01L 27/32* (2006.01)
*G09G 3/3291* (2016.01)

(52) U.S. Cl.
CPC ..... *G09G 3/3648* (2013.01); *H01L 27/3248* (2013.01); *G09G 3/3291* (2013.01); *G09G 2300/0452* (2013.01); *G09G 2320/0295* (2013.01); *G09G 2320/043* (2013.01); *G09G 2330/12* (2013.01); *G09G 2360/148* (2013.01); *H01L 2251/562* (2013.01)

(58) Field of Classification Search
CPC ..... G09G 2320/043; G09G 2330/12; G09G 2320/0295; G09G 2360/148; G09G 3/3291; H01L 27/3248; H01L 2251/562
See application file for complete search history.

(56) References Cited

U.S. PATENT DOCUMENTS 6,243,055 B1 * 6/2001 Fergason ..... G02B 5/3083 345/32
7,129,923 B2 * 10/2006 Lu ..... G09G 3/3648 324/527
7,148,629 B2 * 12/2006 Ha ..... G09G 3/006 315/169.3
7,518,393 B2 * 4/2009 Shirasaki ..... G09G 3/006 324/760.01
7,605,599 B2 * 10/2009 Kwak ..... 324/760.01
8,054,253 B2 * 11/2011 Yoo ..... G09G 3/3233 257/E51.018
8,178,865 B2 * 5/2012 Jeong ..... G09G 3/006 257/350
8,199,102 B2 * 6/2012 Lee ..... G09G 3/3688 345/100
8,427,170 B2 * 4/2013 Morimoto ..... G09G 3/006 324/537
8,587,504 B2 * 11/2013 Joo ..... G09G 3/3614 345/204
9,047,802 B2 * 6/2015 Kwon ..... G09G 3/006
9,087,479 B2 * 7/2015 Park ..... G09G 3/006
2002/0140831 A1 10/2002 Hayashi
2004/0140983 A1 7/2004 Credelle
2004/0196302 A1 * 10/2004 Im ..... G09G 3/3607 345/690
2006/0044298 A1 * 3/2006 Mignard ..... B81C 99/003 345/205
2006/0091814 A1 * 5/2006 Katou ..... G09G 3/32 315/169.1
2006/0195736 A1 * 8/2006 Hayashi ..... G09G 3/006 714/724
2006/0274570 A1 * 12/2006 Jeoung ..... G09G 3/006 365/154
2007/0046581 A1 * 3/2007 Kwak ..... G09G 3/006 345/68
2007/0139312 A1 6/2007 Kwak
2008/0048946 A1 2/2008 Kwak
2008/0054798 A1 * 3/2008 Jeong ..... G09G 3/006 313/504
2009/0109142 A1 * 4/2009 Takahara ..... G09G 3/006 345/76

FOREIGN PATENT DOCUMENTS

KR 10-2004-0105549 12/2004
KR 10-2006-0082128 7/2006
KR 10-2007-0027962 3/2007
KR 10-0732819 6/2007
KR 10-0754140 8/2007

OTHER PUBLICATIONS

Non-Final Office Action dated Aug. 10, 2016, issued in U.S. Appl. No. 14/804,250.
Final Office Action dated Feb. 9, 2017, issued in U.S. Appl. No. 14/804,250.
Notice of Allowance dated Apr. 26, 2017, issued in U.S. Appl. No. 14/804,250.

* cited by examiner

FLAT PANEL DISPLAY DEVICE, METHOD OF AGING THE SAME, AND METHOD OF TESTING LIGHTING OF THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS AND CLAIM OF PRIORITY

This application *is a reissue application of U.S. Pat. No. 9,747,831, filed on Jul. 20, 2015 as U.S. patent application Ser. No. 14/804,250 and issued on Aug. 29, 2017, which* is a continuation application of the prior application Ser. No. 12/385,153 filed in the U.S. Patent & Trademark Office on Mar. 31, 2009 and assigned to the assignee of the present invention. Furthermore, this application makes reference to, incorporates the same herein, and claims all benefits accruing under 35 U.S.C. § 119 from an application earlier filed in the Korean Intellectual Property Office on 1 Apr. 2008 and there duly assigned Serial No. 10-2008-0030261.

BACKGROUND OF THE INVENTION

Field of the Invention

The present invention relates to a flat panel display device formed in a pentile structure and having a pixel portion and lighting tester. The lighting tester applies test voltages or aging voltages to the pixel portion.

Description of the Related Art

Since flat panel display devices are lightweight and thin, they are used as alternatives to cathode-ray tube display devices. Examples of flat panel display devices include liquid crystal display (LCD) devices and organic light emitting diode (OLED) display devices.

The OLED display devices generate excitons by recombination of electrons and holes, which are injected through a cathode and an anode, respectively, in an organic thin film, and emit light having a predetermined wavelength due to energy released from the excitons. The OLED display devices have high brightness and a wide viewing angle, and can be embodied in an ultra slim structure because they do not need a backlight.

A flat panel display device includes red, green and blue pixels to display full color. When the red, green and blue pixels are arranged in stripes, a boundary portion between pixels is visible as though the pixels were surrounded with a black matrix. Thus, image data of the flat panel display device has to be rendered.

Generally, rendering gives a realistic, three-dimensional appearance to an object by tone variation and shading in consideration of external information such as light sources, perspective and color. That is, rendering is an image-processing technique used to display a two- or three-dimensional graphic image. To render its image data, the flat panel display device has to have a plurality of pixels arranged in a pentile structure, which includes a first pixel column, a second pixel column, and a third pixel column. In the first pixel column, first pixels for displaying a first color and second pixels for displaying a second color are alternately arranged in a direction parallel to a plurality of data lines. In the second pixel column, the first pixels and the second pixels are arranged in reverse order of the first pixel column in the direction parallel to the plurality of data lines. In the third pixel column, third pixels for displaying a third color are arranged in the direction parallel to the plurality of data lines.

However, in the flat panel display device having a pentile structure described above, since the first and second pixels are always alternately arranged in one scan line due to the first pixel column in which the first and second pixels are alternately arranged in a direction parallel to the plurality of data lines and the second pixel column in which the first and second pixels are arranged in reverse order of the first pixel column in the direction parallel to the plurality of data lines, a first test voltage for testing lighting of the first pixel or a first aging voltage for aging the first pixel, and a second test voltage for testing lighting of the second pixel and a second aging voltage for aging the second pixel are alternately applied to one data line during the lighting test or the aging process. Thus, a brightness difference may be generated between pixels during the lighting test, and pixels might be excessively or insufficiently aged.

To solve these problems, it is necessary to either employ additional equipment for testing or aging each pixel, or modify conventional equipment for testing and aging a flat panel display device having a striped structure. Thus, additional costs are incurred for the lighting test and aging process of the flat panel display device having a pentile structure.

SUMMARY OF THE INVENTION

The present invention provides a flat panel display device which can sufficiently age each pixel of a pixel portion and prevent a brightness difference between pixels during a lighting test, without adding equipment or modifying conventional equipment, by changing a structure of a lighting tester for applying lighting test voltages and aging voltages to the pixel portion through data lines, and lighting test and aging methods for the same.

According to an embodiment of the present invention, a flat panel display device includes a scan driver for applying scan signals to a plurality of scan lines, a data driver for applying data signals to a plurality of data lines, a pixel portion, and a lighting tester for applying lighting test voltages or aging voltages to the pixel portion. The pixel portion includes a first pixel column including first pixels for displaying a first color and second pixels for displaying a second color, a second pixel column including first pixels for displaying the first color and second pixels for displaying the second color, and a third pixel column including third pixels for displaying a third color. The first and second pixels of the first column are alternately arranged in a direction parallel to the data lines, and each of the first and second pixels of the first pixel column is coupled to one of the scan lines and one of the data lines. The first and the second pixels of the second pixel column are alternately arranged in reverse order of the first pixel column in a direction parallel to the data lines, and each of the first and second pixels of the second pixel column is coupled to one of the scan lines and one of the data lines. The third pixels are arranged in a direction parallel to the data lines, and each of the third pixels is coupled to one of the scan lines and one of the data lines. The lighting tester applies lighting test voltages or aging voltages to the first, second and third pixel columns. The lighting tester applies a first voltage to the first pixel column and applies a second voltage to the second pixel column during a first time period. The lighting tester applies the second voltage to the first pixel column and applies the first voltage to the second pixel column during a second time period.

According to another embodiment of the present invention, a method is provided for testing lighting of a flat panel display device having the structure described above. The method includes steps of electrically connecting the first pixel column to a first test power source and electrically connecting the second pixel column to a second test power source whenever a first control signal is supplied to the lighting tester, electrically connecting the first pixel column to the second test power source and electrically connecting the second pixel column to the first test power source whenever a second control signal is supplied to the lighting tester, and supplying scan signals to the scan lines. The first and second control signals are synchronized with the scan signals.

According to still another embodiment of the present invention, a method is provided for aging a flat panel display device having the structure described above. The method includes steps of connecting a first, a second and a third interconnections to a first, a second and a third aging power sources, respectively, electrically connecting the first pixel column to the first interconnection and electrically connecting the second pixel column to the second interconnection whenever a first control signal is supplied to the lighting tester, electrically connecting the first pixel column to the second interconnection and electrically connecting the second pixel column to the first interconnection whenever a second control signal is supplied to the lighting tester, electrically connecting the third pixel column to the third interconnection whenever a third control signal is supplied to the lighting tester, and supplying scan signals to the scan lines. The first and second control signals are synchronized with the scan signals.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
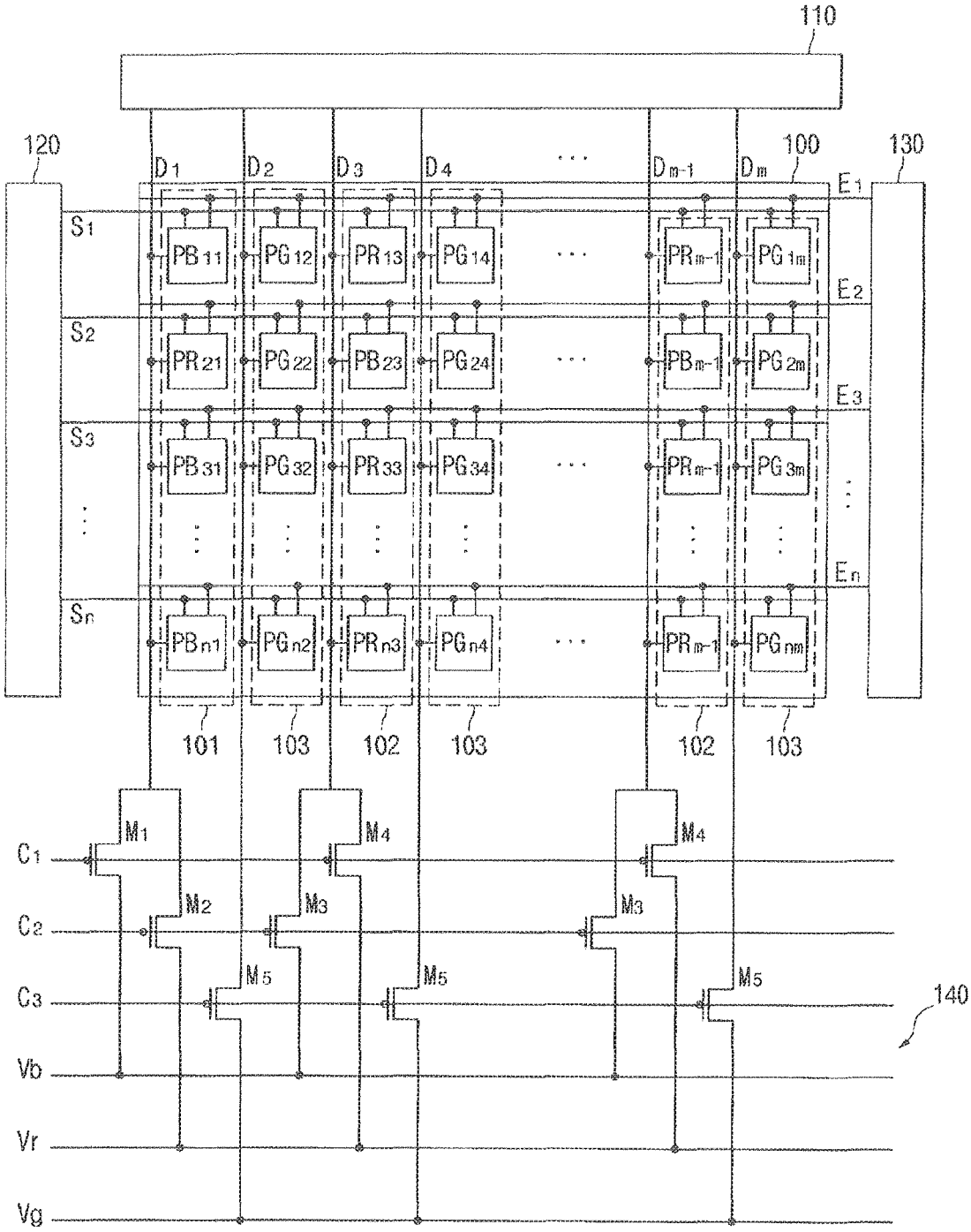
FIG. 1 is a schematic view of a flat panel display device according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a schematic view of a flat panel display device according to an exemplary embodiment of the present invention.

Referring to FIG. 1, the flat panel display device according to the exemplary embodiment of the present invention includes a data driver 110 for applying data signals to a plurality of data lines D1 to Dm, a scan driver 120 for applying scan signals to a plurality of scan lines S1 to Sn, a pixel portion 100, and a lighting tester 140 for applying lighting test voltages or aging voltages to the pixel portion 100. The pixel portion 100 includes a first pixel column 101 in which first pixels PB for displaying blue color and second pixels PR for displaying red color are alternately arranged in a direction parallel to the plurality of data lines D1 to Dm, a second pixel column 102 in which first pixels PB and second pixels PR are arranged in reverse order of the first pixel column 101 in the direction parallel to the plurality of data lines D1 to Dm, and a third pixel column 103 in which third pixels PG for displaying green color are arranged in the direction parallel to the plurality of data lines D1 to Dm. The lighting tester 140 for applying lighting test voltages or aging voltages to the first, second and third pixel columns 101, 102 and 103. Each of pixels PR, PB, and PG is coupled to one of the data lines D1 to Dm and to one of scan lines S1 to Sn.

While the exemplary embodiment of the present invention has the first pixels PB for displaying blue color and the second pixels PR for displaying red color alternately arranged in each of the first and second pixel columns 101 and 102, in alternative embodiments, the first pixels PB for displaying blue color and the third pixels PG for displaying green color, or the second pixels PR for displaying red color and the third pixels PG for displaying green color, may be alternately arranged in each of the first and second pixel columns 101 and 102.

Moreover, while the pixel portion 100 includes the first pixels PB for displaying blue color, the second pixels PR for displaying red color and the third pixels PG for displaying green color in the exemplary embodiment of the present invention, the pixel portion 100 may further include pixels (not illustrated) for displaying one or more colors other than red, green and blue.

The data driver 110 receives red, green and blue digital image signals processed by rendering from a timing controller (not illustrated), and generates red, green and blue data signals synchronized with the scan signals generated from the scan driver 120. The data driver 110 applies the red, green and blue data signals to the pixel portion 100 through the plurality of data lines D1 to Dm electrically connected with the pixel portion 100.

The scan driver 120 sequentially applies the scan signals to the plurality of scan lines S1 to Sn electrically connected with the pixel portion 100, and sequentially selects pixels PB, PR and PG from the first, second and third pixel columns 101, 102 and 103 of the pixel portion 100, respectively.

The lighting tester 140 includes a first transistor M1 coupled between the first pixel column 101 and a first interconnection Vb through which a first voltage for a first pixel PB is supplied, a second transistor M2 coupled between the first pixel column 101 and a second interconnection Vr through which a second voltage for a second pixel PR is supplied, a third transistor M3 coupled between the second pixel column 102 and a first interconnection Vb, a fourth transistor M4 coupled between the second pixel column 102 and the second interconnection Vr, a fifth transistor M5 coupled between the third pixel column 103 and a third interconnection Vg through which a third voltage for a third pixel PG is supplied, a first control interconnection C1 through which a first control signal is applied to turn on the first and fourth transistors M1 and M4, a second control interconnection C2 through which a second control signal is applied to turn on the second and third transistors M2 and M3, and a third control interconnection C3 through which a third control signal is applied to turn on the fifth transistor M5.

Here, while all of the first to fifth transistors M1 to M5 are illustrated as PMOS transistors in the exemplary embodiment of the present invention, the first to fifth transistors M1 to M5 may be NMOS transistors or transistors having different conductivity types from one another.

Further, the first, second and third voltages may be lighting test voltages for testing the lighting of the first, second and third pixel columns 101, 102 and 103, respectively, or aging voltages for aging the first, second and third pixels PB, PR and PG, respectively. For the test of the lighting, the first, second and third interconnections Vb, Vr and Vg are connected to a first, second and third test power sources, respectively. For the aging test, the first, second and third interconnections Vb, Vr and Vg are connected to a first, second and third aging power sources, respectively.

Since the third voltages have to be sequentially applied to the third pixel column 103 in response to the scan signals, the fifth transistor M5 and the third control interconnection C3 may be omitted. However, if duration of application of the first, second or third voltage to pixel PB, PR or PG of the first, second or third pixel column 101, 102 or 103 is shorter than duration of application of a scan signal to each of the plurality of scan lines S1 to Sn (or if a scan signal is applied ahead of the first, second or third voltage applied to the pixel PB, PR or PG), the first, second or third voltage applied to the pixel PB, PR or PG is not sufficiently recorded, which may cause a brightness difference between the pixels PB, PR and PG Thus, it is preferable that the fifth transistor M5 and the third control interconnection C3 are included in the lighting tester 140.

In addition, the flat panel display device according to the exemplary embodiment of the present invention may further include an emission controller 130 for applying an emission control signal to the pixel portion 100 to emit light from the first, second and third pixels PB, PR and PG after sufficient lighting test voltages are applied to the first, second and third pixels PB, PR and PG of the pixel columns 101, 102 and 103, respectively, during the lighting test for the first, second and third pixel columns 101, 102 and 103.

Figure 2:
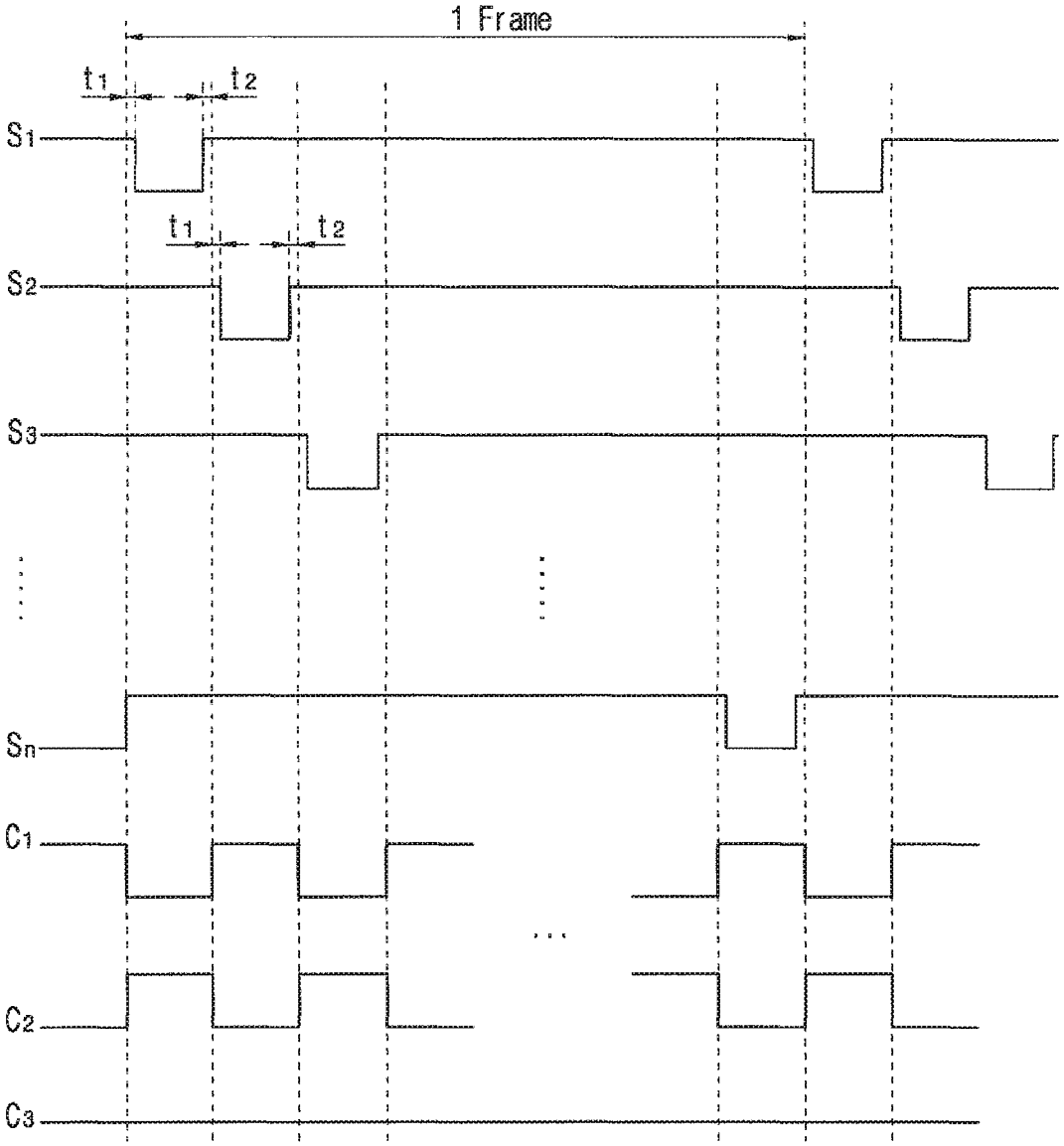
FIG. 2 is a timing diagram of scan and control signals applied to a flat panel display device according to an exemplary embodiment of the present invention.

FIG. 2 is a timing diagram of signals applied to the flat panel display device according to an exemplary embodiment of the present invention.

According to a driving method during a lighting test or an aging process for the flat panel display device according to the exemplary embodiment of the present invention, the scan signals are sequentially applied to the plurality of scan lines S1 to Sn so as to sequentially select pixels PB, PR and PG from the first, second and third pixel columns 101, 102 and 103 of the pixel portion 100, and first and second control signals are synchronized with the scan signals and applied to the first and second control interconnections C1 an C2 of the lighting tester.

Now, voltages applied to the pixel columns 101, 102 and 103 from the lighting tester by the first and second control signals through the plurality of scan lines S1 to Sn to which the scan lines are applied will be described with reference to FIG. 2.

First, when a first scan line S1 is selected from the plurality of scan lines S1 to Sn, which can be referred to as a first time period, the first transistor M1 coupled between the first pixel column 101 and the first interconnection Vb, and the forth transistor M4 coupled between the second pixel column 102 and the second interconnection Vr through which the second voltage for the second pixel PR is supplied, are turned on in response to a low-level first control signal applied through the first control interconnection C1. And, the third transistor M3 coupled between the second pixel column 102 and the first interconnection Vb, and the second transistor M2 coupled between the second pixel column 101 and the second interconnection Vr, are turned off in response to a high-level second control signal applied through the second control interconnection C2.

Accordingly, a first voltage is applied to a first pixel PB11 of the first pixel column 101 electrically connected with the first scan line S1, and a second voltage is applied to a second pixel PR13 of the second pixel column 102 electrically connected with the first scan line S1.

Since a third control signal applied through the third control interconnection C3 is in a low level, the fifth transistor M5 coupled between the third pixel column 103 and the third interconnection Vg is turned on, and a third voltage is applied to a third pixel PG12 of the third pixel column 103 electrically connected with the first scan line S1.

Next, when a second scan line S2 is selected from the plurality of scan lines S1 to Sn, which can be referred to as a second time period, the first transistor M1 coupled between the first pixel column 101 and the first interconnection Vb, and the forth transistor M4 coupled between the second pixel column 102 and the second interconnection Vr through which a second voltage for the second pixel PR is supplied, are turned off in response to a high-level first control signal applied through the first control interconnection C1. And, the third transistor M3 coupled between the second pixel column 102 and the first interconnection Vb, and the second transistor M2 coupled between the first pixel column 101 and the second interconnection Vr, are turned on in response to a low-level second control signal applied through the second control interconnection C2.

Accordingly, a first voltage is applied to a second pixel PR21 of the first pixel column 101 electrically connected with the second scan line S2, and a second voltage is applied to a first pixel PB23 of the second pixel column 102 electrically connected with the second scan line S2.

Since a third control signal applied through the third control interconnection C3 is in a low level, the fifth transistor M5 coupled between the third pixel column 103 and the third interconnection Vg is turned on, and a third voltage is applied to the third pixel PG22 of the third pixel column 103 electrically connected with the third scan line S2.

Here, when the scan signal is applied ahead of the first, second and third voltages to the respective pixels PB, PR and PG, the first, second and third voltages applied to the respective pixels PB, PR and PG are not sufficiently recorded, which may cause a brightness difference between the pixels PB, PR and PG. Thus, the first, second and third voltages have to be applied faster than the scan signals by a leading time t1 and longer than the scan signal by a lagging time t2 to the respective pixels PB, PR and PG in response to the first, second and third control signals. That is, the first, second and third voltages applied to the respective pixels PB, PR and PG of the first, second and third pixel columns 101, 102 and 103 have to have larger pulse widths than the scan signals applied by the plurality of scan lines S1 to Sn.

Subsequently, when a third scan line S3 is selected from the plurality of scan lines S1 to Sn, which also can be referred to as the first time period, like when the first scan line S1 is selected as described above, a low-level first control signal is applied through the first control interconnection C1, a high-level second control signal is applied through the second control interconnection C2, and a low-level third control signal is applied through the third control interconnection C3. Thus, the first transistor M1 coupled between the first pixel column 101 and the first interconnection Vb, the fourth transistor M4 coupled between the second pixel column 102 and the second interconnection Vr through which a second voltage for a second pixel PR is supplied, and the fifth transistor M5 coupled between the third pixel column 103 and the third interconnection Vg are turned on. And, the third transistor M3 disposed between the second pixel column 102 and the first interconnection Vb and the second transistor M2 disposed between the first pixel column 101 and the second interconnection Vr are turned off.

Accordingly, a first voltage is applied to the first pixel line 101 electrically connected with the first scan line S1, a second voltage is applied to the second pixel column 102 electrically connected with the first scan line S1, and a third voltage is applied to the third pixel column 103.

While the lighting test or aging process is performed on the pixel portion using the lighting tester in the exemplary embodiment of the present invention, if the lighting tester includes a lighting test power source and an aging power source, the lighting test may be performed by connecting a lighting test voltage source corresponding to each pixel to the first, second or third interconnection, and then the aging process may be performed by connecting an aging power source corresponding to each pixel to the first, second or third interconnection, and vice versa.

As a result, the flat panel display device according to the exemplary embodiment of the present invention has the first to fourth transistors controlled in response to the first and second control signals, which are disposed between the first and second interconnections and the first and second pixel columns of the lighting tester. Here, the first and second control signals are synchronized with the scan signals and inverted with respect to each other, such that the first or second interconnection to which a different voltage is supplied is connected with each of the first and second pixel columns having the first and second pixels arranged in reverse order to apply a different direct current therethrough. Thus, the lighting test or aging process can be performed for each pixel of each pixel column, and direct lighting test voltages or direct aging voltages can be applied to corresponding pixels, without adding equipment or modifying conventional equipment.

Consequently, a flat panel display device according to the present invention has first pixel column in which first pixels for displaying a first color and second pixels for displaying a second color are alternately arranged in a direction parallel to a plurality of data lines, and second pixel column in which first and second pixels are arranged in reverse order in a direction parallel to the plurality of data lines. The first and second columns are connected with first and second interconnections to which different voltages are supplied in response to first and second control signals of a lighting tester, both signals are synchronized with scan signals such that different direct voltages are applied through the first and second interconnections. Thus, the present invention can test the lighting of each pixel or sufficiently age each pixel of the pixel portion without adding equipment or modifying conventional equipment, and can prevent a brightness difference between pixels during the lighting test.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A flat panel display device, comprising:

a scan driver configured to apply scan signals to a plurality of scan lines;

a data driver configured to apply data signals to a plurality of data lines;

a pixel portion including:

a first pixel column including at least one first pixel configured to display a first color and at least one second pixel configured to display a second color, the first and second pixels of the first column being arranged in a direction parallel to the plurality of data lines;

a second pixel column including at least one first pixel configured to display the first color and at least one second pixel configured to display the second color, the first and the second pixels of the second pixel column being arranged in a direction parallel to the plurality of data lines, said at least one first pixel of the first pixel column and said at least one second pixel in the second pixel column being coupled to the same scan line; and a third pixel column including third pixels configured to display a third color, the third pixels being arranged in a direction parallel to the plurality of data lines, each of the third pixels being coupled to one of the scan lines and one of the data lines; and a lighting tester configured to apply lighting test voltages or aging voltages to the first, second and third pixel columns, to apply a first voltage to the first pixel column and a second voltage to the second pixel column during a first time period, and to apply the second voltage to the first pixel column and the first voltage to the second pixel column during a second time period, both of the first voltage and the second voltage supplied from test power sources for lighting the first and second pixel columns or both of the first voltage and the second voltage supplied from aging power sources for aging the first and second pixel columns.

2. The device according to claim 1, wherein a first control signal is supplied to the lighting tester during the first time period, and a second control signal is supplied to the lighting tester during the second time period.

3. The device according to claim 2, wherein the lighting tester includes:

a first transistor electrically connecting the first pixel column to a first interconnection supplying the first voltage whenever the first control signal is supplied to the first transistor;

a second transistor electrically connecting the first pixel column to a second interconnection supplying the second voltage whenever the second control signal is supplied to the second transistor;

a third transistor electrically connecting the second pixel column to the first interconnection whenever the second control signal is supplied to the third transistor; and, a fourth transistor electrically connecting the second pixel column to the second interconnection whenever the first control signal is supplied to the fourth transistor.

4. The device according to claim 3, wherein the first to fourth transistors have the same conductivity type.

5. The device according to claim 3, wherein a third control signal is supplied to the lighting tester, a third voltage being applied to the third pixel column whenever the third control signal is supplied, the lighting tester further including:

a fifth transistor electrically connecting the third pixel column to a third interconnection supplying the third voltage whenever the third control signal is supplied to the fifth transistor.

6. The device according to claim 5, wherein the first to fifth transistors have the same conductivity type.

7. The device according to claim 5, wherein the first, second and third voltages are test voltages for testing lighting of the first, second and third pixel columns, or the first, second and third voltages are aging voltages for aging said at least one first pixel, said at least one second pixel, and the third pixels.

8. The device according to claim 1, further comprising:

an emission controller for controlling emission of said at least one first pixel, said at least one second pixel, and the third pixels.

9. The device according to claim 1, wherein each of the first color, the second color and the third color is red, green, or blue, and the first, second, and third colors are different from each other.

10. A method of testing lighting of a flat panel display device comprising a plurality of scan lines, a plurality of data lines, a pixel portion including a first pixel column in which at least one first pixel *configured* for displaying a first color and at least one second pixel configured [display] *for displaying* a second color are arranged in a direction parallel to the plurality of data lines, a second pixel column in which at least one first pixel and at least one second pixel are arranged in a direction parallel to the plurality of data lines, and a third pixel column in which third pixels configured to display a third color are arranged in a direction parallel to the plurality of data lines, and a lighting tester configured to apply lighting test voltages to the first, second and third pixel columns through the plurality of data lines, said at least one first pixel of the first pixel column and said at least one second pixel in the second pixel column being coupled to the same scan line, the method comprising:

*supplying a first control signal to the lighting tester to cause the lighting tester to* electrically [connecting] *connect* the first pixel column to a first test power source and electrically [connecting] *connect* the second pixel column to a second test power source[whenever a first control signal is supplied to the lighting tester], a first voltage supplied from the first test power source being applied to the first pixel column, a second voltage supplied from the second test power source being applied to the second pixel column;

*supplying a second control signal to the lighting tester to cause the lighting tester to* electrically [connecting] *connect* the first pixel column to the second test power source and electrically [connecting] *connect* the second pixel column to the first test power source[whenever a second control signal is supplied to the lighting tester], the second voltage being applied to the first pixel column and the first voltage being applied to the second pixel column, both of the first voltage and the second voltage being non-zero lighting test voltages for lighting the first and second pixel columns; and supplying scan signals to the scan lines, *wherein* the *supplying of the* first and second control signals [being] *is* synchronized with the scan signals.

11. The method according to claim 10, further comprising:

turning on a first transistor coupled between the first pixel column and the first test power source and turning on a fourth transistor coupled between the second pixel column and the second test power source [whenever] *when* the first control signal is supplied; and turning on a second transistor coupled between the first pixel column and the second test power source, and turning on a third transistor coupled between the second pixel column and the first test power source [whenever] *when* the second control signal is supplied.

12. The method according to claim 10, further comprising:

*supplying a third control signal to the lighting tester to cause the lighting tester to* electrically [connecting] *connect* the third pixel column to a third test power source[whenever a third control signal is supplied to the lighting tester].

13. The method according to claim 12, further comprising:

turning on a fifth transistor coupled between the third pixel column and the third test power source [whenever] *when* the third control signal is supplied.

14. The method according to claim 10, further comprising:

applying an emission control signal to the pixel portion for controlling emission of said at least one first pixel, said at least one second pixel, and the third pixels.

15. A method of aging a flat panel display device comprising a plurality of scan lines, a plurality of data lines, a pixel portion including a first pixel column in which at least one first pixel configured [display] *for displaying* a first color and at least one second pixel *configured* for displaying a second color are arranged in a direction parallel to the plurality of data lines, a second pixel column in which at least one first pixel and at least one second pixel are arranged in a direction parallel to the plurality of data lines, and a third pixel column in which third pixels *configured* for displaying a third color are arranged in a direction parallel to the plurality of data lines, and a lighting tester configured apply aging voltages to the first, second and third pixel columns through the plurality of data lines, said at least one first pixel of the first pixel column and said at least one second pixel in the second pixel column being coupled to the same scan line, the method comprising:

connecting a first, a second and a third interconnections to a first, a second and a third aging power sources, respectively, a first voltage supplied to the first interconnection from the first aging power source, a second voltage supplied to the second interconnection from the second aging power source;

*supplying a first control signal to the lighting tester to cause the lighting tester to* electrically [connecting] *connect* the first pixel column to the first interconnection and electrically [connecting] *connect* the second pixel column to the second interconnection[whenever a first control signal is supplied to the lighting tester], the first voltage being applied to the first pixel column through the first interconnection, a second voltage being applied to the second pixel column through the second interconnection;

*supplying a second control signal to the lighting tester to cause the lighting tester to* electrically [connecting] *connect* the first pixel column to the second interconnection and electrically [connecting] *connect* the second pixel column to the first interconnection[whenever a second control signal is supplied to the lighting tester], the second voltage being applied to the first pixel column through the second interconnection and the first voltage being applied to the second pixel column through the first interconnection, both of the first voltage and the second voltage being non-zero aging voltages for aging the first and second pixel columns;

*supplying a third control signal to the lighting tester to cause the lighting tester to* electrically [connecting] *connect* the third pixel column to the third interconnection[whenever a third control signal is supplied to the lighting tester]; and supplying scan signals to the scan lines, *wherein* the *supplying of the* first and second control signals [being] *is* synchronized with the scan signals.

16. The method according to claim 15, further comprising:

turning on a first transistor coupled between the first pixel column and the first interconnection, and turning on a fourth transistor coupled between the second pixel column and the second interconnection [whenever] *when* the first control signal is supplied;

turning on a second transistor coupled between the first pixel column and the second interconnection, and turning on a third transistor coupled between the second pixel column and the first interconnection [whenever] *when* the second control signal is supplied; and turning on a fifth transistor coupled between the third pixel column and the third interconnection [whenever] *when* the third control signal is supplied.

17. The method according to claim 15, further comprising:

applying emission control signals to the pixel portion to control emission of said at least one first pixel, said at least one second pixel, and the third pixels.

18. The method according to claim 15, further comprising:

connecting the first and second interconnections to a first and a second test power sources, respectively;

electrically connecting the first pixel column to the first interconnection and electrically connecting the second pixel column to the second interconnection [whenever] *when* the first control signal is supplied; and electrically connecting the first pixel column to the second interconnection and electrically connecting the second pixel column to the first interconnection [whenever] *when* the second control signal is supplied.

19. The method according to claim 18, further comprising:

turning on a first transistor coupled between the first pixel column and the first interconnection, and turning on a fourth transistor coupled between the second pixel column and the second interconnection [whenever] *when* the first control signal is supplied; and turning on a second transistor coupled between the first pixel column and the second interconnection, and turning on a third transistor coupled between the second pixel column and the first interconnection [whenever] *when* the second control signal is supplied.

[20. The method according to claim 19, further comprising:

turning on a fifth transistor coupled between the third pixel column and the third interconnection whenever the third control signal is supplied.]

21. The method according to claim 18, further comprising:

connecting the third interconnection to a third test power source; and electrically connecting the third pixel column to the third interconnection [whenever] *when* the third control signal [us] *is* supplied.

*22. The method according to claim 19, further comprising:*

*turning on a fifth transistor coupled between the third pixel column and the third interconnection when the third control signal is supplied.*

*23. A display device, comprising:*

*a scan driver configured to apply scan signals to a plurality of scan lines;*

*a data driver configured to apply data signals to a plurality of data lines;*

*a plurality of first pixels disposed in a first column, configured to display a first color, and electrically connected to a first data line of the data lines;*

*a plurality of second pixels disposed in the first column, configured to display a second color, and electrically connected to the first data line of the data lines;*

*a plurality of third pixels disposed in a second column, configured to display a third color, and electrically connected to a second data line of the data lines; and*

*a lighting tester comprising:*

*a first transistor including an end electrically connected to the first data line;*

*a second transistor including an end electrically connected to the first data line;*

*a third transistor including an end electrically connected to the second data line;*

*a first interconnection connected to another end of the first transistor;*

*a second interconnection connected to another end of the second transistor;*

*a third interconnection connected to another end of the third transistor;*

*a first control interconnection connected to a gate of the first transistor;*

*a second control interconnection connected to a gate of the second transistor; and*

*a third control interconnection connected to a gate of the third transistor,*

*wherein the first interconnection is configured to supply a first voltage, the second interconnection is configured to supply a second voltage, and the third interconnection is configured to supply a third voltage,*

*wherein the first control interconnection is configured to supply a first control signal, the second control interconnection is configured to supply a second control signal, and the third control interconnection is configured to supply a third control signal,*

*wherein the lighting tester is disposed outside of an area where the first, the second, and the third pixels are disposed,*

*wherein both of the first voltage and the second voltage are supplied to the first column through the first data line, and*

*wherein each of the first voltage, the second voltage, and the third voltage is supplied from test power sources for lighting the first, second, and third pixel columns, or each of the first voltage, the second voltage, and the third voltage is supplied from aging power sources for aging the first and second columns.*

*24. The display device according to claim 23,*

*wherein one of the first pixels and one of the second pixels is alternately connected to the first data line.*

*25. The display device according to claim 24, further comprising:*

*a third data line;*

*a plurality of fourth pixels disposed in a third column, configured to display the first color, and electrically connected to the third data line of the data lines; and*

*a plurality of fifth pixels disposed in a third column, configured to display the second color, and electrically connected to the third data line.*

*26. The display device according to claim 25,*

*wherein one of the fourth pixels and one of the fifth pixels are alternately connected to the third data line.*

*27. The display device according to claim 26,*

*wherein the second data line is arranged in between the first data line and the third data line.*

*28. The display device according to claim 27, further comprising:*

*a fourth transistor including an end electrically connected to the third data line;*

*a fifth transistor including an end electrically connected to the third data line;*

*a fourth interconnection connected to another end of the fourth transistor; and*

*a fifth interconnection connected to another end of the fifth transistor,*

*wherein the first control interconnection is connected to a gate of the fifth transistor, and*

*wherein the second control interconnection is connected to a gate of the fourth transistor.*

*29. The display device according to claim 23, further comprising:*

*an emission controller configured to control emission of one of the first pixels, one of the second pixels, and one of the third pixels.*

*30. The display device according to claim 29,*

*wherein one of the first pixels and one of the second pixels are alternately connected to the first data line.*

*31. The display device according to claim 30, further comprising:*

*a third data line;*

*a plurality of fourth pixels disposed in a third column, configured to display the first color, and electrically connected to the third data line of the data lines; and*

*a plurality of fifth pixels disposed in a third column, configured to display the second color, and electrically connected to the third data line.*

*32. The display device according to claim 31,*

*wherein one of the fourth pixels and one of the fifth pixels are alternately connected to the third data line.*

*33. The display device according to claim 32,*

*wherein the second data line is arranged in between the first data line and the third data line.*

*34. The display device according to claim 33, further comprising:*

*a fourth transistor including an end electrically connected to the third data line;*

*a fifth transistor including an end electrically connected to the third data line;*

*a fourth interconnection connected to another end of the fourth transistor; and*

*a fifth interconnection connected to another end of the fifth transistor,*

*wherein the first control interconnection is connected to a gate of the fifth transistor, and*

*wherein the second control interconnection is connected to a gate of the fourth transistor.*

* * * * *